United States Patent
Yang

(10) Patent No.: US 12,506,484 B2
(45) Date of Patent: Dec. 23, 2025

(54) CHARGE PUMP FILTERING CIRCUIT, PHASE-LOCKED LOOP CIRCUIT, AND CLOCK DATA RECOVERY CIRCUIT

(71) Applicant: Realtek Semiconductor Corporation, Hsinchu (TW)

(72) Inventor: Jun Yang, Jiangsu Province (CN)

(73) Assignee: Realtek Semiconductor Corporation, Hsinchu (TW)

( * ) Notice: Subject to any disclaimer, the term of this patent is extended or adjusted under 35 U.S.C. 154(b) by 4 days.

(21) Appl. No.: 18/482,021

(22) Filed: Oct. 6, 2023

(65) Prior Publication Data
US 2024/0120926 A1    Apr. 11, 2024

(30) Foreign Application Priority Data

Oct. 11, 2022   (CN) .......................... 202211240136.0

(51) Int. Cl.
*H03L 7/089* (2006.01)
*H03L 7/091* (2006.01)
*H03L 7/099* (2006.01)

(52) U.S. Cl.
CPC ............ *H03L 7/0891* (2013.01); *H03L 7/091* (2013.01); *H03L 7/0992* (2013.01)

(58) Field of Classification Search
CPC ..... H03L 7/00; H03L 7/06; H03L 7/08; H03L 7/085; H03L 7/093
See application file for complete search history.

(56) References Cited

U.S. PATENT DOCUMENTS 8,278,984 B2 * 10/2012 Lamanna ................ H03L 7/093
                                                                  375/373
2010/0214031 A1    8/2010 Yamamoto et al.

OTHER PUBLICATIONS

Yido Koo et al., "A fully integrated CMOS frequency synthesizer with charge-averaging charge pump and dual-path loop filter for PCS- and cellular-CDMA wireless systems," in IEEE Journal of Solid-State Circuits, vol. 37, No. 5, pp. 536-542, May 2002, doi: 10.1109/4.997845.
Daniel Friedman, "Hybrid PLL architectures and implementations," 2018 IEEE Custom Integrated Circuits Conference (CICC), 2018, pp. 1-89, doi: 10.1109/CICC.2018.8357110.

* cited by examiner

*Primary Examiner* — Diana J. Cheng
(74) *Attorney, Agent, or Firm* — CKC & Partners Co., LLC

(57) ABSTRACT

A charge pump filtering circuit includes a charge pump circuit and a filter circuit. The charge pump circuit includes a first switch and a second switch. The first switch and the second switch are coupled at a first node and are coupled between a power terminal and a ground terminal. The filter circuit includes a first capacitor, a second capacitor, and a first voltage switching circuit. The first capacitor is coupled between the first node and the ground terminal. The second capacitor is coupled between the first voltage switching circuit and the first node.

20 Claims, 13 Drawing Sheets

CHARGE PUMP FILTERING CIRCUIT, PHASE-LOCKED LOOP CIRCUIT, AND CLOCK DATA RECOVERY CIRCUIT

RELATED APPLICATIONS

This application claims priority to Chinese Application Serial Number 202211240136.0, filed Oct. 11, 2022, which is herein incorporated by reference.

BACKGROUND

Technical Field

The present disclosure relates to a charge pump filtering circuit, a phase-locked loop circuit including the charge pump filtering circuit, and a clock data recovery circuit including the charge pump filtering circuit.

Description of Related Art

With developments of technology, various circuits have been developed. For example, a phase-locked loop circuit or a clock data recovery circuit usually includes a charge pump circuit and a filter circuit. However, the charge pump circuit and the filter circuit in current methods have many disadvantages.

SUMMARY

Some aspects of the present disclosure are to provide a charge pump filtering circuit. The charge pump filtering circuit includes a charge pump circuit and a filter circuit. The charge pump circuit includes a first switch and a second switch. The first switch and the second switch are coupled at a first node and are coupled between a power terminal and a ground terminal. The filter circuit includes a first capacitor, a second capacitor, and a first voltage switching circuit. The first capacitor is coupled between the first node and the ground terminal. The second capacitor is coupled between the first voltage switching circuit and the first node.

Some aspects of the present disclosure are to provide a phase-locked loop circuit. The phase-locked loop circuit includes a phase frequency detector circuit, a charge pump filtering circuit, a voltage-controlled oscillator circuit, and a frequency divider. The phase frequency detector circuit is configured to generate a first signal and a second signal according to a feedback clock signal and a reference clock signal. The charge pump filtering circuit is configured to generate a filtering voltage according to the first signal and the second signal. The voltage-controlled oscillator circuit is configured to generate an output signal according to the filtering voltage. The frequency divider is configured to generate the feedback clock signal according to the output signal. The charge pump filtering circuit includes a charge pump circuit and a filter circuit. The charge pump circuit includes a first switch and a second switch. The first switch and the second switch are coupled at a first node and are coupled between a power terminal and a ground terminal. The filter circuit includes a first capacitor, a second capacitor, and a first voltage switching circuit. The first capacitor is coupled between the first node and the ground terminal. The second capacitor is coupled between the first voltage switching circuit and the first node.

Some aspects of the present disclosure are to provide a clock data recovery circuit. The clock data recovery circuit includes a phase detector circuit, a charge pump filtering circuit, a voltage-controlled oscillator circuit, and a frequency divider. The phase detector circuit is configured to generate a first signal and a second signal according to a feedback clock signal and data. The charge pump filtering circuit is configured to generate a filtering voltage according to the first signal and the second signal. The voltage-controlled oscillator circuit is configured to generate an output signal according to the filtering voltage. The frequency divider is configured to generate the feedback clock signal according to the output signal. The charge pump filtering circuit includes a charge pump circuit and a filter circuit. The charge pump circuit includes a first switch and a second switch. The first switch and the second switch are coupled at a first node and are coupled between a power terminal and a ground terminal. The filter circuit includes a first capacitor, a second capacitor, and a first voltage switching circuit. The first capacitor is coupled between the first node and the ground terminal. The second capacitor is coupled between the first voltage switching circuit and the first node.

BRIEF DESCRIPTION OF THE DRAWINGS

The disclosure can be more fully understood by reading the following detailed description of the embodiment, with reference made to the accompanying drawings as follows.

DETAILED DESCRIPTION

In the present disclosure, "connected" or "coupled" may refer to "electrically connected" or "electrically coupled."

"Connected" or "coupled" may also refer to operations or actions between two or more elements.

Figure 1:
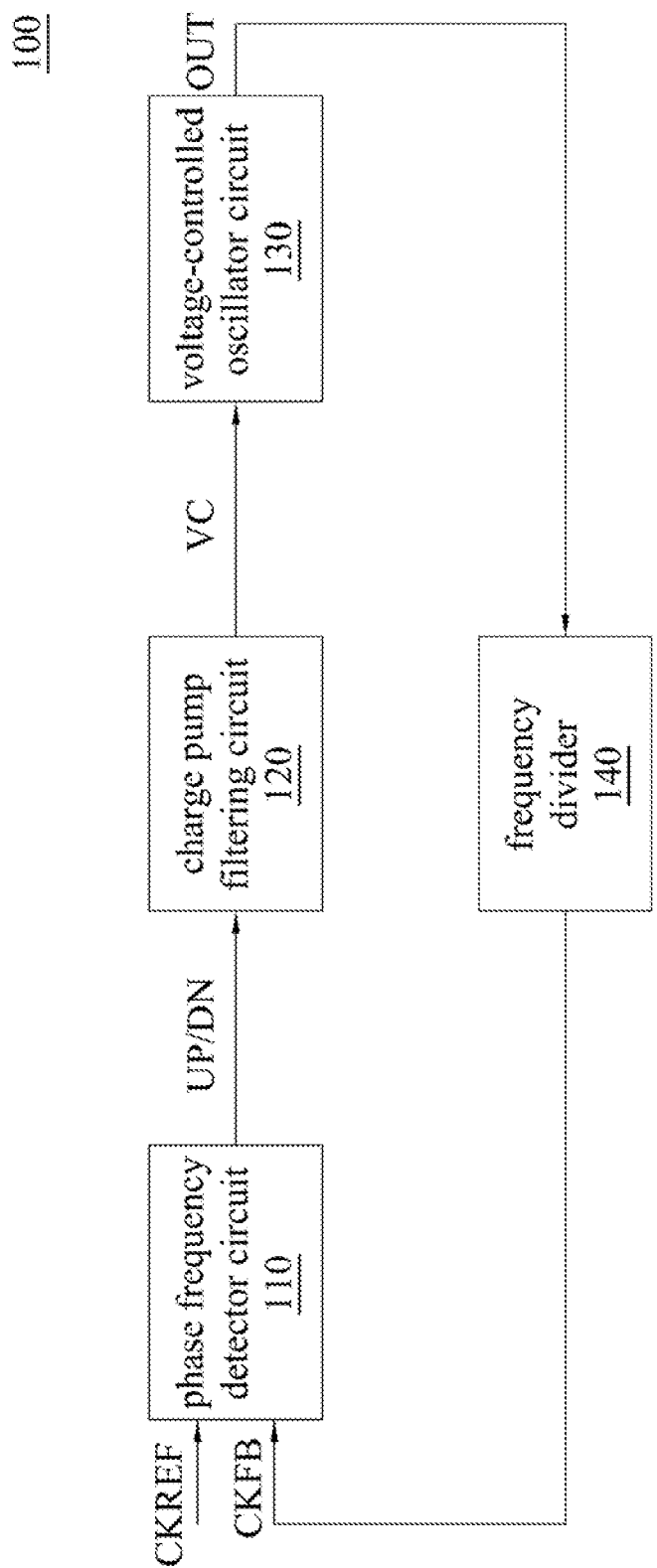
FIG. 1 is a schematic diagram of a phase-locked loop circuit according to some embodiments of the present disclosure.

Reference is made to FIG. 1. FIG. 1 is a schematic diagram of a phase-locked loop circuit 100 according to some embodiments of the present disclosure.

As illustrated in FIG. 1, the phase-locked loop circuit 100 includes a phase frequency detector circuit 110, a charge pump filtering circuit 120, a voltage-controlled oscillator circuit 130, and a frequency divider 140.

The phase frequency detector circuit 110 generates a signal UP and a signal DN according to a feedback clock signal CKFB and a reference clock signal CKREF. The charge pump filtering circuit 120 generates a filtering voltage VC according to the signal UP and the signal DN. The voltage-controlled oscillator circuit 130 generates an output signal OUT according to the filtering voltage VC. The frequency divider 140 generates the feedback clock signal CKFB according to the output signal OUT.

Various suitable implementations of the phase frequency detector circuit 110, the voltage-controlled oscillator circuit 130, and the frequency divider 140 are within the contemplated scopes of the present disclosure. The implementations of the charge pump filtering circuit 120 are described with reference to FIG. 3 to FIG. 13 in following paragraphs.

Figure 2:
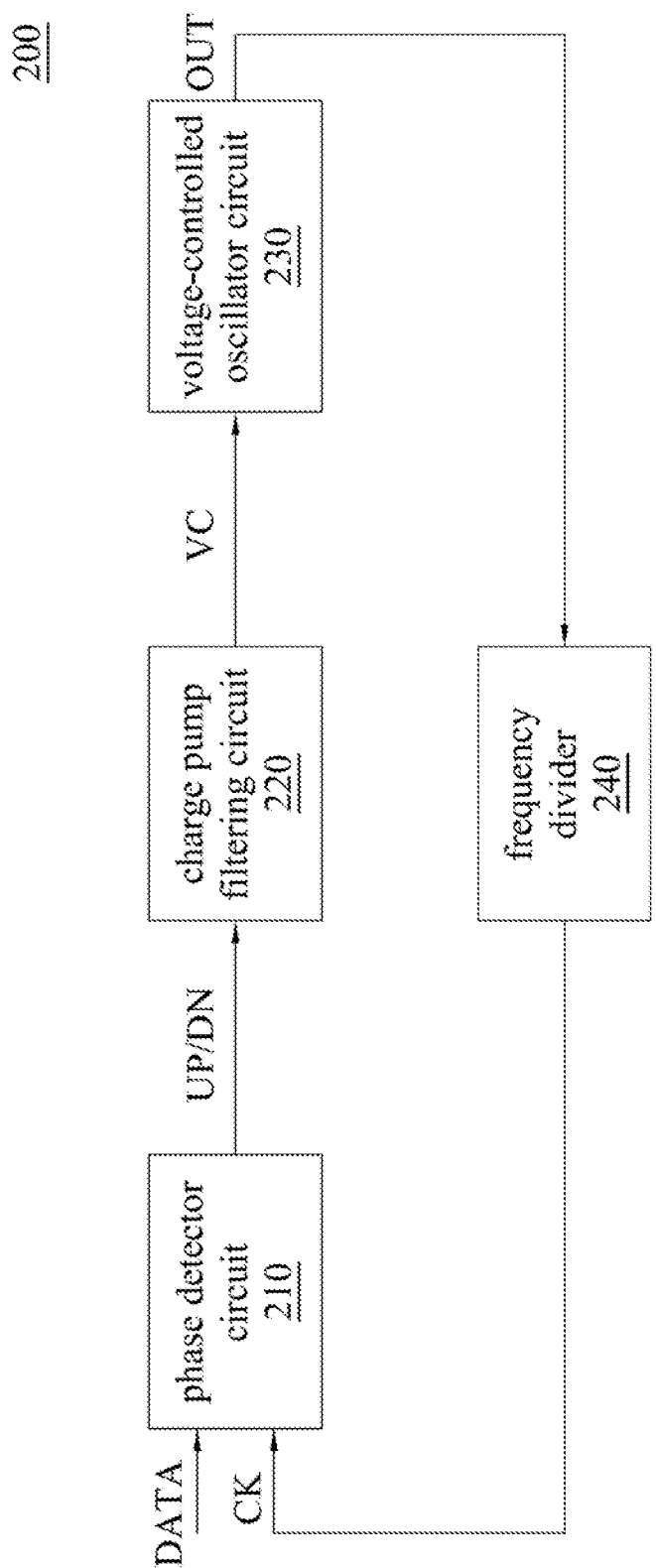
FIG. 2 is a schematic diagram of a clock data recovery circuit according to some embodiments of the present disclosure.

Reference is made to FIG. 2. FIG. 2 is a schematic diagram of a clock data recovery circuit 200 according to some embodiments of the present disclosure.

As illustrated in FIG. 2, the clock data recovery circuit 200 includes a phase detector circuit 210, a charge pump filtering circuit 220, a voltage-controlled oscillator circuit 230, and a frequency divider 240. The phase detector circuit 210 generates a signal UP and a signal DN according to a feedback clock signal CK and data DATA. The charge pump filtering circuit 220 generates a filtering voltage VC according to the signal UP and the signal DN. The voltage-controlled oscillator circuit 230 generates an output signal OUT according to the filtering voltage VC. The frequency divider 240 generates the feedback clock signal CK according to the output signal OUT.

Various suitable implementations of the phase detector circuit 210, the voltage-controlled oscillator circuit 230, and the frequency divider 240 are within the contemplated scopes of the present disclosure. The implementations of the charge pump filtering circuit 220 are described with reference to FIG. 3 to FIG. 13 in following paragraphs.

Figure 3:
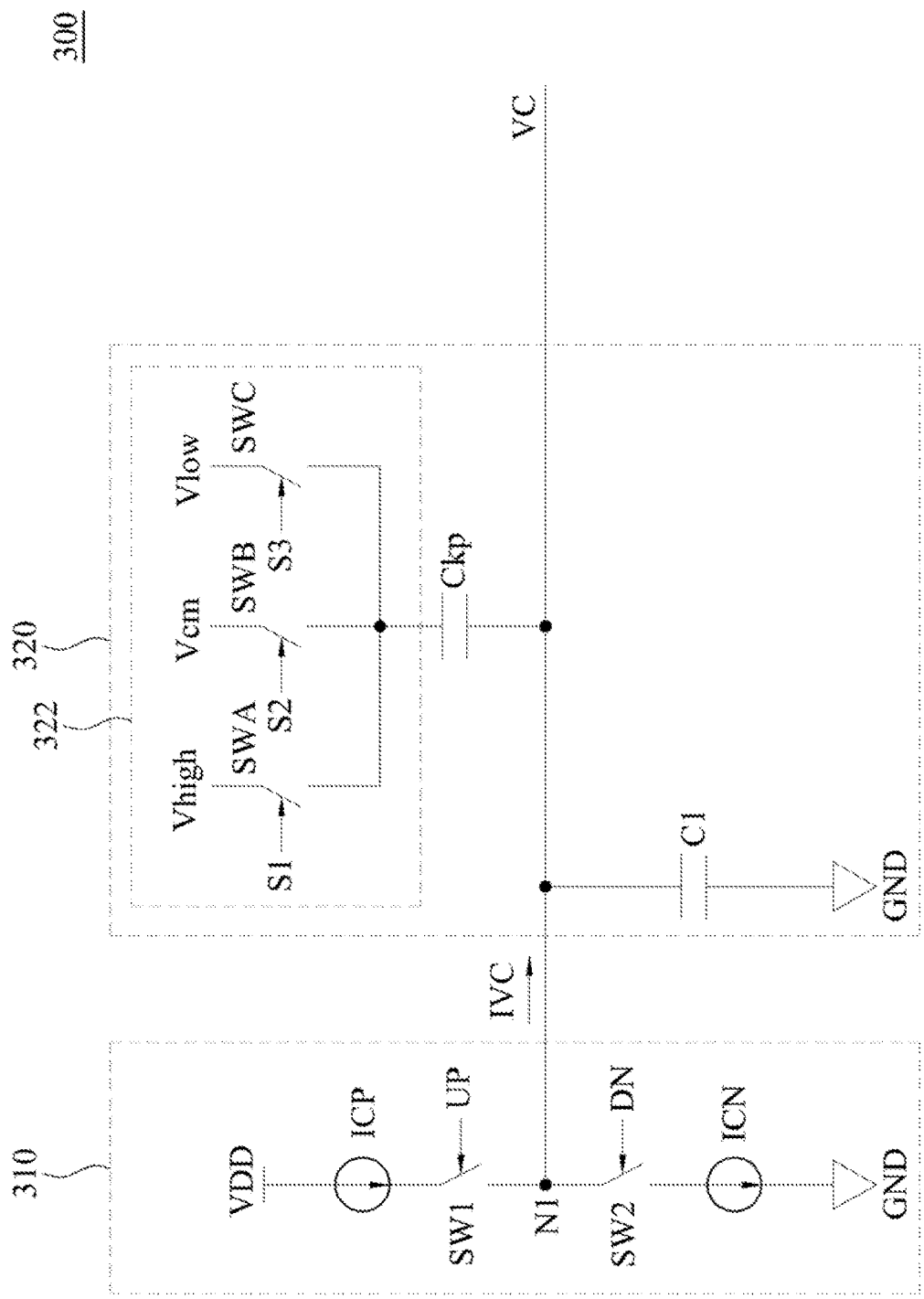
FIG. 3 is a schematic diagram of a charge pump filtering circuit according to some embodiments of the present disclosure.

Reference is made to FIG. 3. FIG. 3 is a schematic diagram of a charge pump filtering circuit 300 according to some embodiments of the present disclosure. In some embodiments, the charge pump filtering circuit 300 can be used to implement the charge pump filtering circuit 120 in FIG. 1 or the charge pump filtering circuit 220 in FIG. 2.

As illustrated in FIG. 3, the charge pump filtering circuit 300 includes a charge pump circuit 310 and a filter circuit 320, and the filter circuit 320 can be a low-pass filter circuit.

The charge pump circuit 310 includes a switch SW1 and a switch SW2. The switch SW1 and the switch SW2 are coupled at a node N1 and coupled between a power terminal VDD and a ground terminal GND. A filtering voltage VC is generated at the node N1. The switch SW1 is turned on or turned off by the signal UP. The switch SW2 is turned on or turned off by the signal DN. When the switch SW1 is turned on and the switch SW2 is turned off, an output current IVC is a positive current ICP (as one current source). When the switch SW2 is turned on and the switch SW1 is turned off, the output current IVC is a negative current ICN (as another current source).

The filter circuit 320 includes a capacitor C1, a capacitor Ckp, and a voltage switching circuit 322. The capacitor C1 is coupled between the node N1 and the ground terminal GND. The capacitor Ckp is coupled between the voltage switching circuit 322 and the node N1.

The voltage switching circuit 322 includes a control switch SWA, a control switch SWB, and a control switch SWC. First terminals of the control switch SWA, the control switch SWB, and the control switch SWC receive a voltage Vhigh, a voltage Vcm, and a voltage Vlow respectively. Second terminals of the control switch SWA, the control switch SWB, and the control switch SWC are coupled to the capacitor Ckp. A control signal S1, a control signal S2, and a control signal S3 are used to turn on or turn off the control switch SWA, the control switch SWB, and the control switch SWC respectively.

In some embodiments, the voltage Vhigh is higher than the voltage Vcm, and the voltage Vcm is higher than the voltage Vlow, but the present disclosure is not limited thereto. For example, the voltage Vhigh can be equal to a power voltage at the power terminal VDD, the voltage Vlow can be equal to a ground voltage at the ground terminal GND, and the voltage Vcm can be half of a sum of the voltage Vhigh and the voltage Vlow.

When the signal UP corresponds to a first logic value (e.g., a logic value 1) and the signal DN corresponds to a second logic value (e.g., a logic value 0), the control signal S1 corresponds to the first logic value and the control signal S2 and the control signal S3 correspond to the second logic value to turn on the control switch SWA and to turn off the control switch SWB and the control switch SWC. When the signal UP corresponds to the second logic value and the signal DN corresponds to the first logic value, the control signal S3 corresponds to the first logic value and the control signal S1 and the control signal S2 correspond to the second logic value to turn on the control switch SWC and to turn off the control switch SWA and the control switch SWB. When the signal UP and the signal DN correspond to the first logic value or when the signal UP and the signal DN correspond to the second logic value, the control signal S2 corresponds to the first logic value and the control signal S1 and the control signal S3 correspond to the second logic value to turn on the control switch SWB and to turn off the control switch SWA and the control switch SWC. By the operations above, a filtering voltage VC is generated at the node N1.

Figure 4:
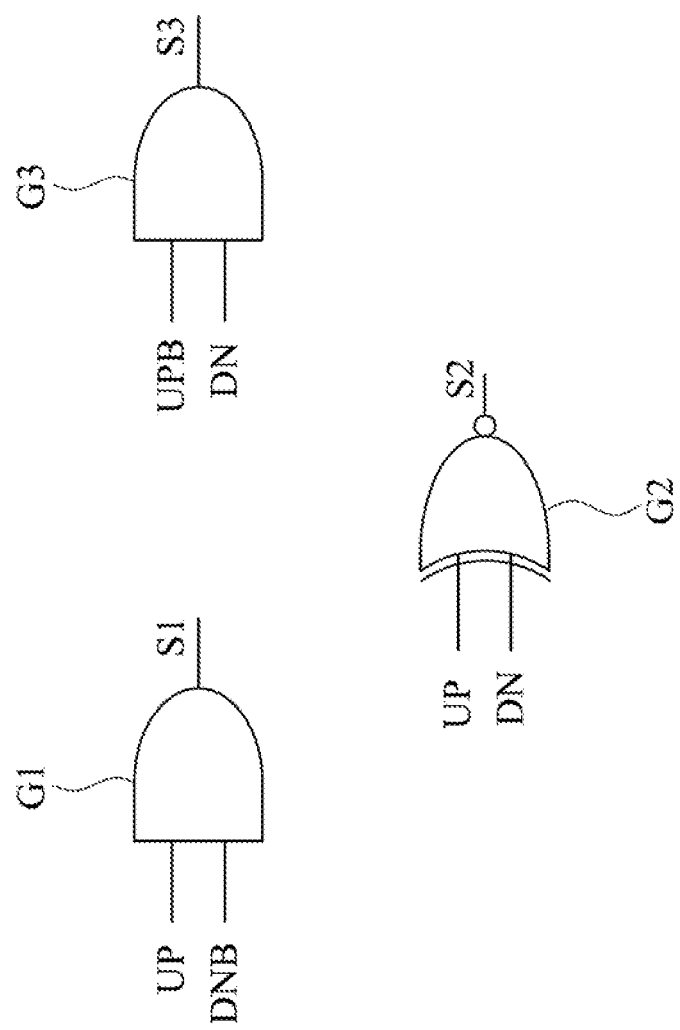
FIG. 4 is a schematic diagram of a plurality of logic gates according to some embodiments of the present disclosure.

Reference is made to FIG. 4. FIG. 4 is a schematic diagram of a plurality of logic gates G1-G3 according to some embodiments of the present disclosure.

As illustrated in FIG. 4, the logic gate G1 is an AND gate and used to perform an AND operation on the signal UP and an inversion signal DNB (an inversion of the signal DN) to obtain the control signal S1. The logic gate G2 is an XNOR gate and used to perform an XNOR operation on the signal UP and the signal DN to obtain the control signal S2. The logic gate G3 is an AND gate and used to perform an AND operation on an inversion signal UPB (an inversion of the signal UP) and the signal DN to obtain the control signal S3.

In some conventional methods, the filter circuit working with the charge pump circuit includes a resistor, a first capacitor, and a second capacitor. The resistor and the first capacitor are coupled in series, and the resistor and the first capacitor in series are coupled to the second capacitor in parallel. In some related approaches, in order to reduce noise of the resistor, the size of the first capacitor needs to be larger. In some related approaches, in order to reduce the size of the first capacitor, an additional charge pump circuit and an additional operational amplifier are required. However, the operational amplifier introduces additional noise.

Compared to the aforementioned conventional methods and the related approaches, the present disclosure does not need the resistor in the aforementioned conventional methods, and can use the voltage switching circuit and the capacitor Ckp to achieve the effect equivalent to the resistor. Accordingly, under the same performance requirement, the size of the capacitor C1 can be smaller and the present disclosure does not need the additional charge pump circuit and the additional operational amplifier. Thus, the present disclosure has simpler architecture and a smaller area.

Figure 5:
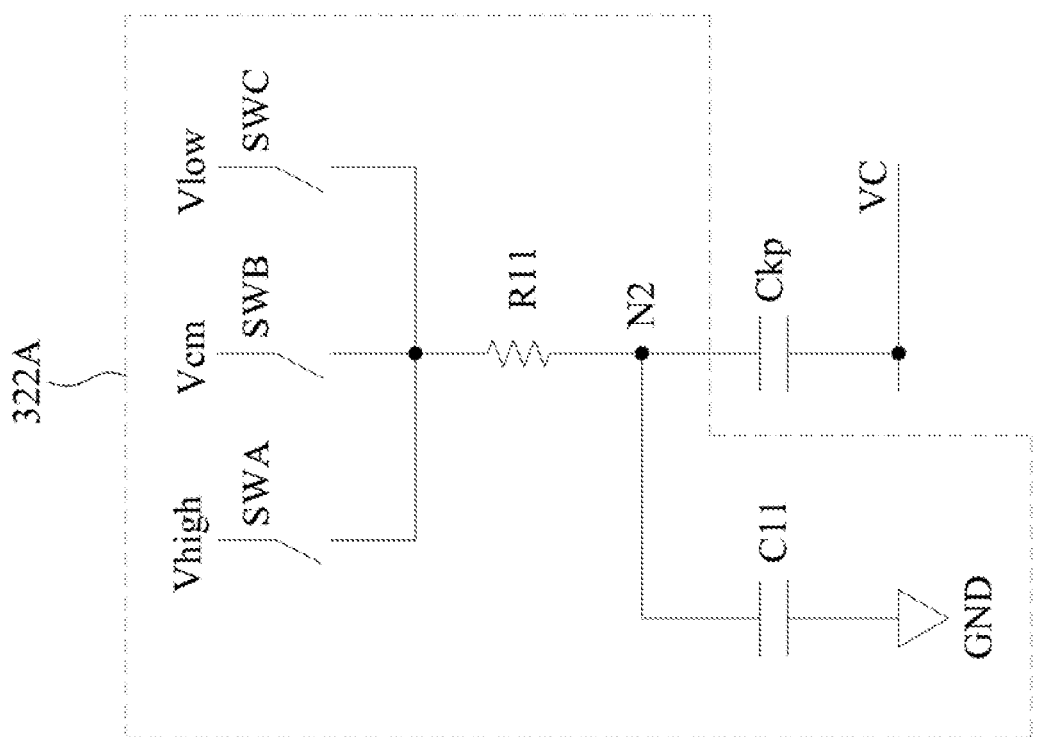
FIG. 5 is a schematic diagram of a voltage switching circuit according to some embodiments of the present disclosure.

Reference is made to FIG. 5. FIG. 5 is a schematic diagram of a voltage switching circuit 322A according to some embodiments of the present disclosure.

Compared to the voltage switching circuit 322 in FIG. 3, the voltage switching circuit 322A in FIG. 5 further includes a resistor R11 and a capacitor C11. The resistor R11 is coupled between the control switches SWA-SWC and the capacitor Ckp. The capacitor C11 is coupled between a node N2 and the ground terminal GND, and the resistor R11 and the capacitor Ckp are coupled at the node N2. Compared to the filtering voltage VC in FIG. 3, the filtering voltage VC in FIG. 5 is smoother.

Figure 6:
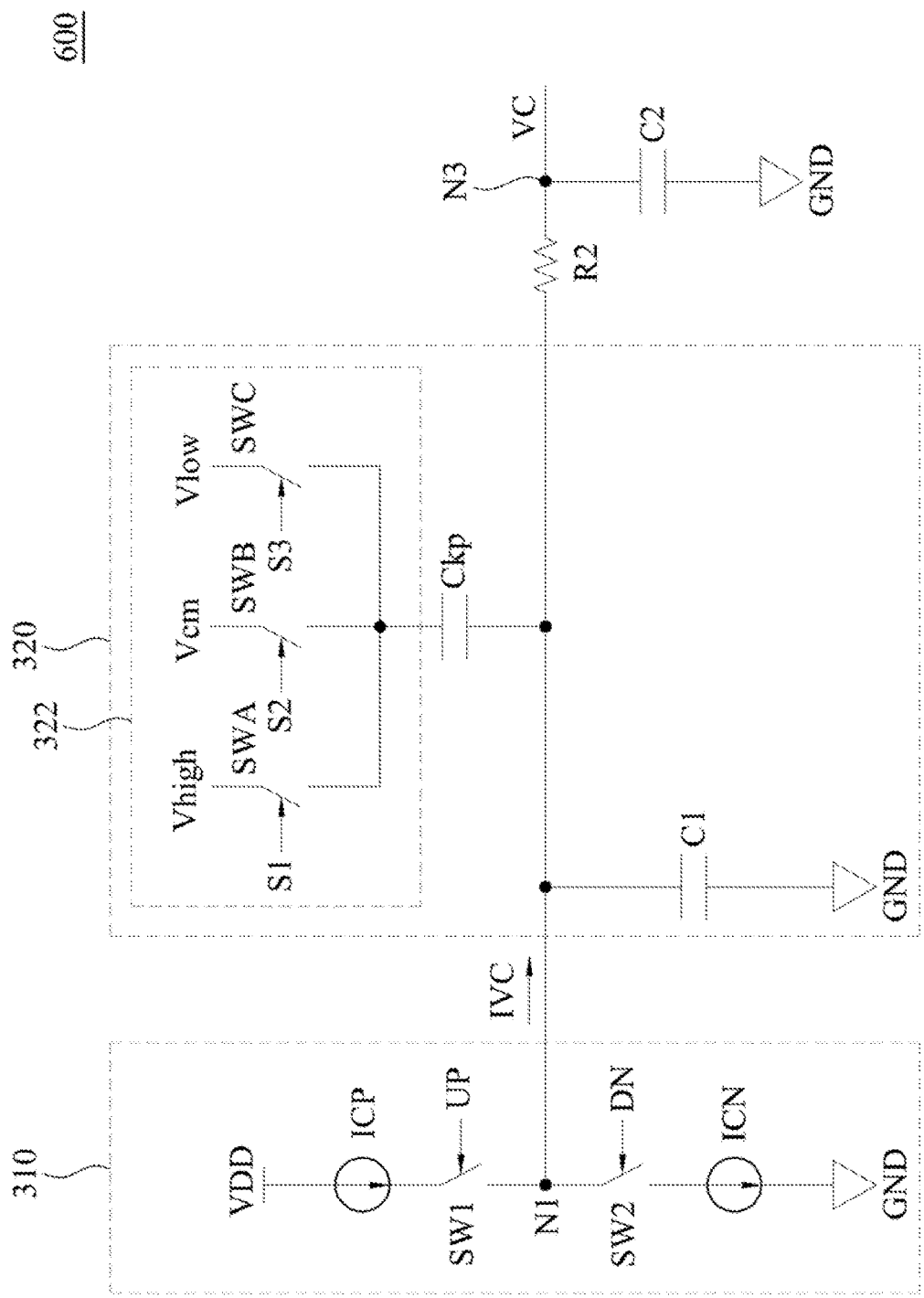
FIG. 6 is a schematic diagram of a charge pump filtering circuit according to some embodiments of the present disclosure.

Reference is made to FIG. 6. FIG. 6 is a schematic diagram of a charge pump filtering circuit 600 according to some embodiments of the present disclosure. In some embodiments, the charge pump filtering circuit 600 can be used to implement the charge pump filtering circuit 120 in FIG. 1 or the charge pump filtering circuit 220 in FIG. 2.

Compared to the charge pump filtering circuit 300 in FIG. 3, the charge pump filtering circuit 600 in FIG. 6 further includes a resistor R2 and a capacitor C2. The resistor R2 is coupled between the node N1 and an output node N3. The capacitor C2 is coupled between the output node N3 and the ground terminal GND. The filtering voltage VC is generated at the output node N3. By disposing the resistor R2 and the capacitor C2, the charge pump filtering circuit 600 can achieve the low-pass filtering effect with more orders to cancel more ripple and noise.

Figure 7:
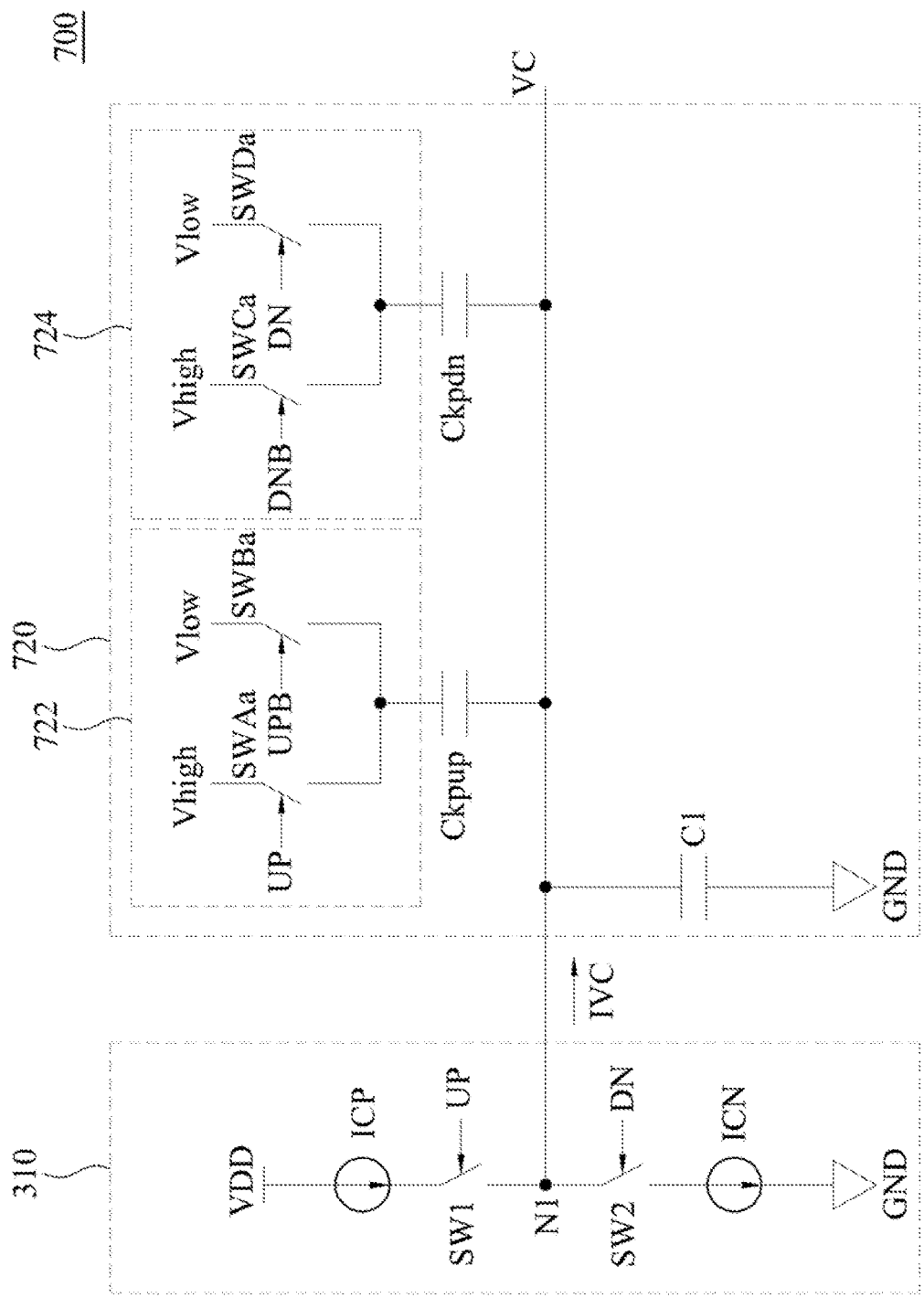
FIG. 7 is a schematic diagram of a charge pump filtering circuit according to some embodiments of the present disclosure.

Reference is made to FIG. 7. FIG. 7 is a schematic diagram of a charge pump filtering circuit 700 according to some embodiments of the present disclosure. In some embodiments, the charge pump filtering circuit 700 can be used to implement the charge pump filtering circuit 120 in FIG. 1 or the charge pump filtering circuit 220 in FIG. 2.

As illustrated in FIG. 7, the charge pump filtering circuit 700 includes a charge pump circuit 310 and a filter circuit 720, and the filter circuit 720 can be a low-pass filter circuit.

The filter circuit 720 includes a capacitor C1, a capacitor Ckpup, a voltage switching circuit 722, a capacitor Ckpdn, and a voltage switching circuit 724. The capacitor C1 is coupled between the node N1 and the ground terminal GND. The capacitor Ckpup is coupled between the voltage switching circuit 722 and the node N1. The capacitor Ckpdn is coupled between the voltage switching circuit 724 and the node N1. In some embodiments, a capacitance value of the capacitor Ckpup is equal to a capacitance value of the capacitor Ckpdn, but the present disclosure is not limited thereto.

The voltage switching circuit 722 includes a control switch SWAa and a control switch SWBa. The voltage switching circuit 724 includes a control switch SWCa and a control switch SWDa. A first terminal of the control switch SWAa receives the voltage Vhigh, a second terminal of the control switch SWAa is coupled to the capacitor Ckpup, and the signal UP is used to turn on or turn off the control switch SWAa. A first terminal of the control switch SWBa receives the voltage Vlow, a second terminal of the control switch SWBa is coupled to the capacitor Ckpup, and the inversion signal UPB is used to turn on or turn off the control switch SWBa. A first terminal of the control switch SWCa receives the voltage Vhigh, a second terminal of the control switch SWCa is coupled to the capacitor Ckpdn, and the inversion signal DNB is used to turn on or turn off the control switch SWCa. A first terminal of the control switch SWDa receives the voltage Vlow, a second terminal of the control switch SWDa is coupled to the capacitor Ckpdn, and the signal DN is used to turn on or turn off the control switch SWDa.

When the signal UP corresponds to the first logic value (e.g., the logic value 1) and the signal DN corresponds to the second logic value (e.g., the logic value 0), the control switch SWAa and the control switch SWCa are turned on and the control switch SWBa and the control switch SWDa are turned off. When the signal UP corresponds to the second logic value and the signal DN corresponds to the first logic value, the control switch SWBa and the control switch SWDa are turned on and the control switch SWAa and the control switch SWCa are turned off. When the signal UP and the signal DN correspond to the first logic value, the control switch SWAa and the control switch SWDa are turned on and the control switch SWBa and the control switch SWCa are turned off. When the signal UP and the signal DN correspond to the second logic value, the control switch SWBa and the control switch SWCa are turned on and the control switch SWAa and the control switch SWDa are turned off.

Figure 8:
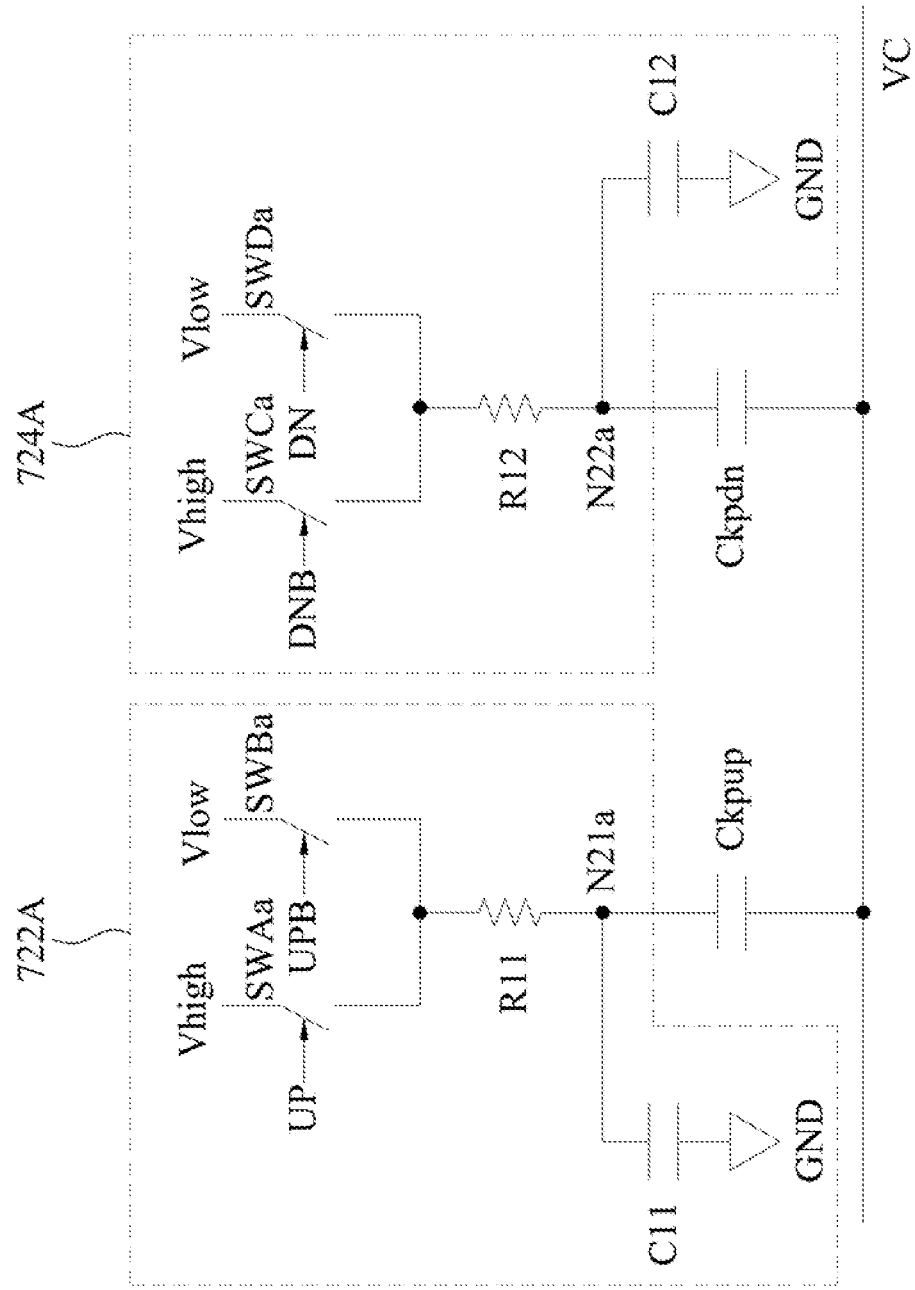
FIG. 8 is a schematic diagram of two voltage switching circuits according to some embodiments of the present disclosure.

Reference is made to FIG. 8. FIG. 8 is a schematic diagram of a voltage switching circuit 722A and a voltage switching circuit 724A according to some embodiments of the present disclosure.

Compared to the voltage switching circuit 722 and the voltage switching circuit 724 in FIG. 7, the voltage switching circuit 722A in FIG. 8 further includes a resistor R11 and a capacitor C11 and the voltage switching circuit 724A in FIG. 8 further includes a resistor R12 and a capacitor C12. The resistor R11 is coupled between the control switch SWAa-SWBa and the capacitor Ckpup. The capacitor C11 is coupled between a node N21a and the ground terminal GND, and the resistor R11 and the capacitor Ckpup are coupled at the node N21a. The resistor R12 is coupled between the control switch SWCa-SWDa and the capacitor Ckpdn. The capacitor C12 is coupled between a node N22a and the ground terminal GND, and the resistor R12 and the capacitor Ckpdn are coupled at the node N22a. Compared to the filtering voltage VC in FIG. 7, the filtering voltage VC in FIG. 8 is smoother.

Figure 9:
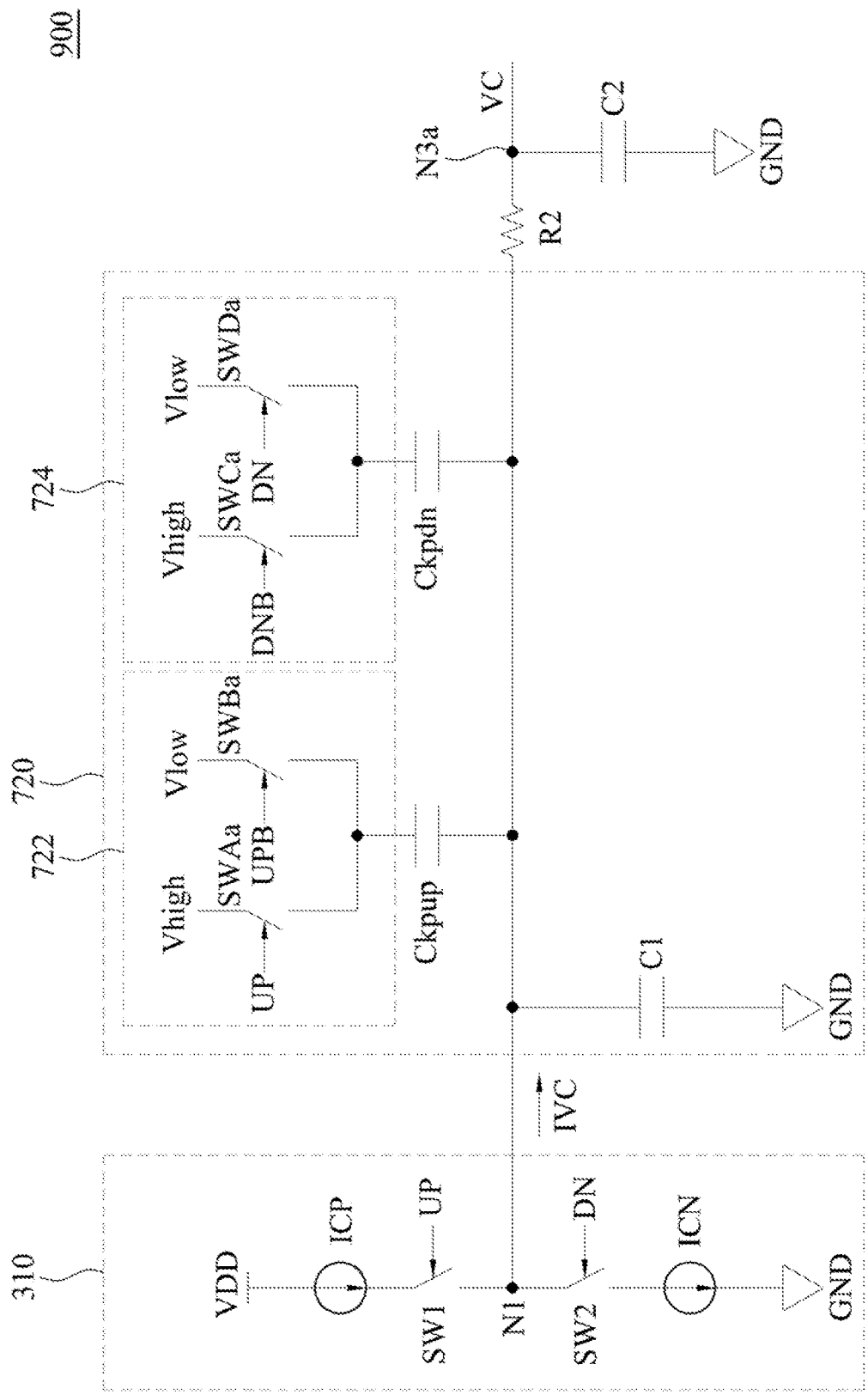
FIG. 9 is a schematic diagram of a charge pump filtering circuit according to some embodiments of the present disclosure.

Reference is made to FIG. 9. FIG. 9 is a schematic diagram of a charge pump filtering circuit 900 according to some embodiments of the present disclosure. In some embodiments, the charge pump filtering circuit 900 can be used to implement the charge pump filtering circuit 120 in FIG. 1 or the charge pump filtering circuit 220 in FIG. 2.

Compared to the charge pump filtering circuit 700 in FIG. 7, the charge pump filtering circuit 900 in FIG. 9 further includes a resistor R2 and a capacitor C2. The resistor R2 is coupled between the node N1 and an output node N3a. The capacitor C2 is coupled between the output node N3a and the ground terminal GND. The filtering voltage VC is generated at the output node N3a. By disposing the resistor R2 and the capacitor C2, the charge pump filtering circuit 900 can achieve the low-pass filtering effect with more orders to cancel more ripple and noise.

Figure 10:
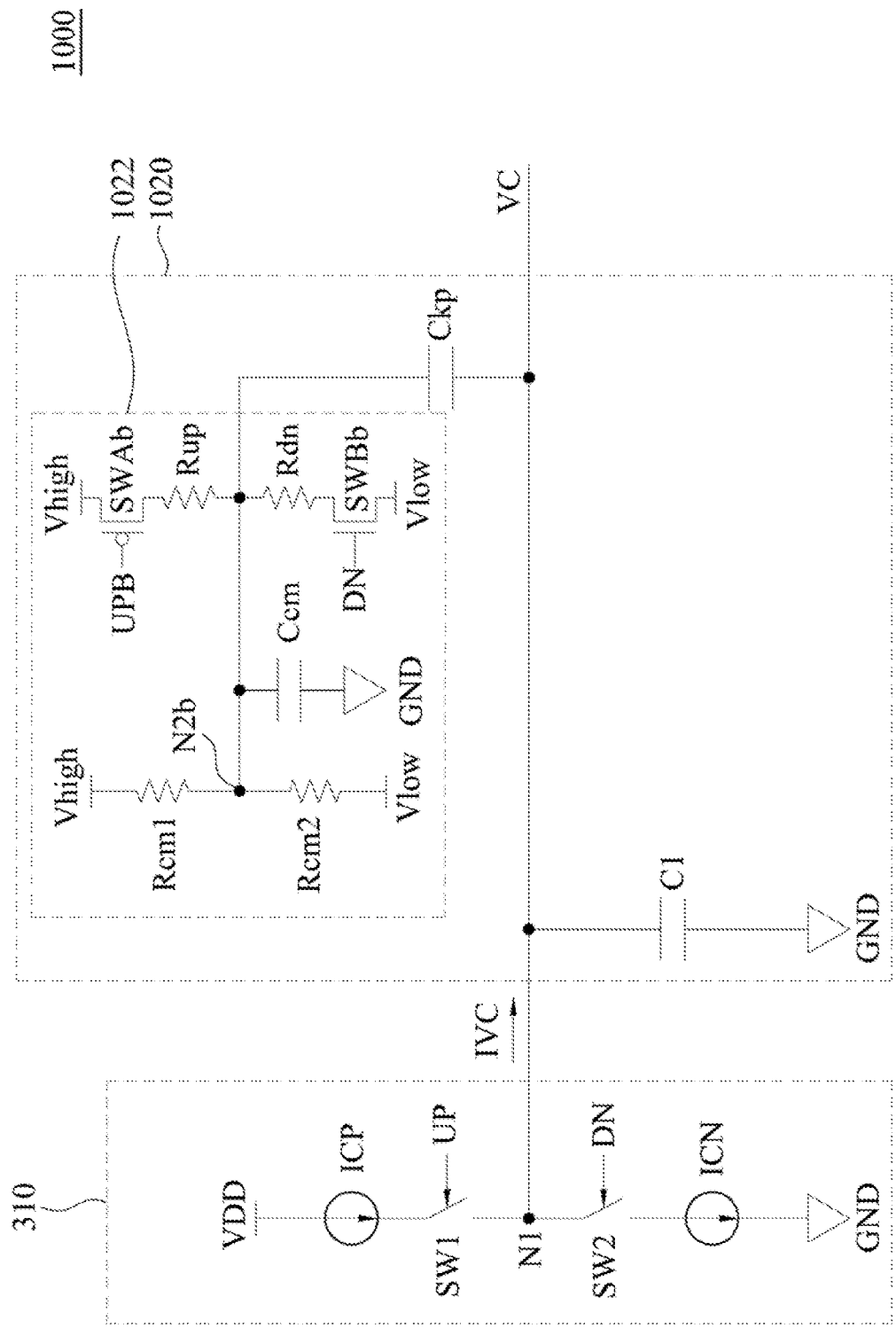
FIG. 10 is a schematic diagram of a charge pump filtering circuit according to some embodiments of the present disclosure.

Reference is made to FIG. 10. FIG. 10 is a schematic diagram of a charge pump filtering circuit 1000 according to some embodiments of the present disclosure. In some embodiments, the charge pump filtering circuit 1000 can be used to implement the charge pump filtering circuit 120 in FIG. 1 or the charge pump filtering circuit 220 in FIG. 2.

As illustrated in FIG. 10, the charge pump filtering circuit 1000 includes the charge pump circuit 310 and a filter circuit 1020, and the filter circuit 1020 can be a low-pass filter circuit.

The filter circuit 1020 includes a capacitor C1, a capacitor Ckp, and a voltage switching circuit 1022. The capacitor C1 is coupled between the node N1 and the ground terminal GND. The capacitor Ckp is coupled between the voltage switching circuit 1022 and the node N1.

The voltage switching circuit 1022 includes a resistor Rcm1, a resistor Rcm2, a capacitor Ccm, a control switch SWAb, a control switch SWBb, a resistor Rup, and a resistor Rdn. The resistor Rcm1 and the resistor Rcm2 are coupled at a node N2b and used to receive the voltage Vhigh and the voltage Vlow. The capacitor Ccm is coupled between the node N2b and the ground terminal GND. The control switch SWAb receives the voltage Vhigh. The control switch SWBb receives the voltage Vlow. The resistor Rup and the resistor Rdn are coupled at the node N2b and are coupled between the control switch SWAb and the control switch SWBb. The capacitor Ckp is coupled between the node N2b and the node N1. The inversion signal UPB is used to turn on or turn off the control switch SWAb. The signal DN is used to turn on or turn off the control switch SWBb. In this example, the control switch SWAb is implemented by a P-type switch, and the control switch SWBb is implemented by a N-type switch.

When the signal UP corresponds to the first logic value (e.g., the logic value 1) and the signal DN corresponds to the second logic value (e.g., the logic value 0), the control switch SWAb is turned on and the control switch SWBb is turned off. When the signal UP corresponds to the second logic value and the signal DN corresponds to the first logic value, the control switch SWAb is turned off and the control switch SWBb is turned on. When the signal UP and the signal DN correspond to the first logic value, the control switch SWAb and the control switch SWBb are turned on. When the signal UP and the signal DN correspond to the second logic value, the control switch SWAb and the control switch SWBb are turned off.

Figure 11:
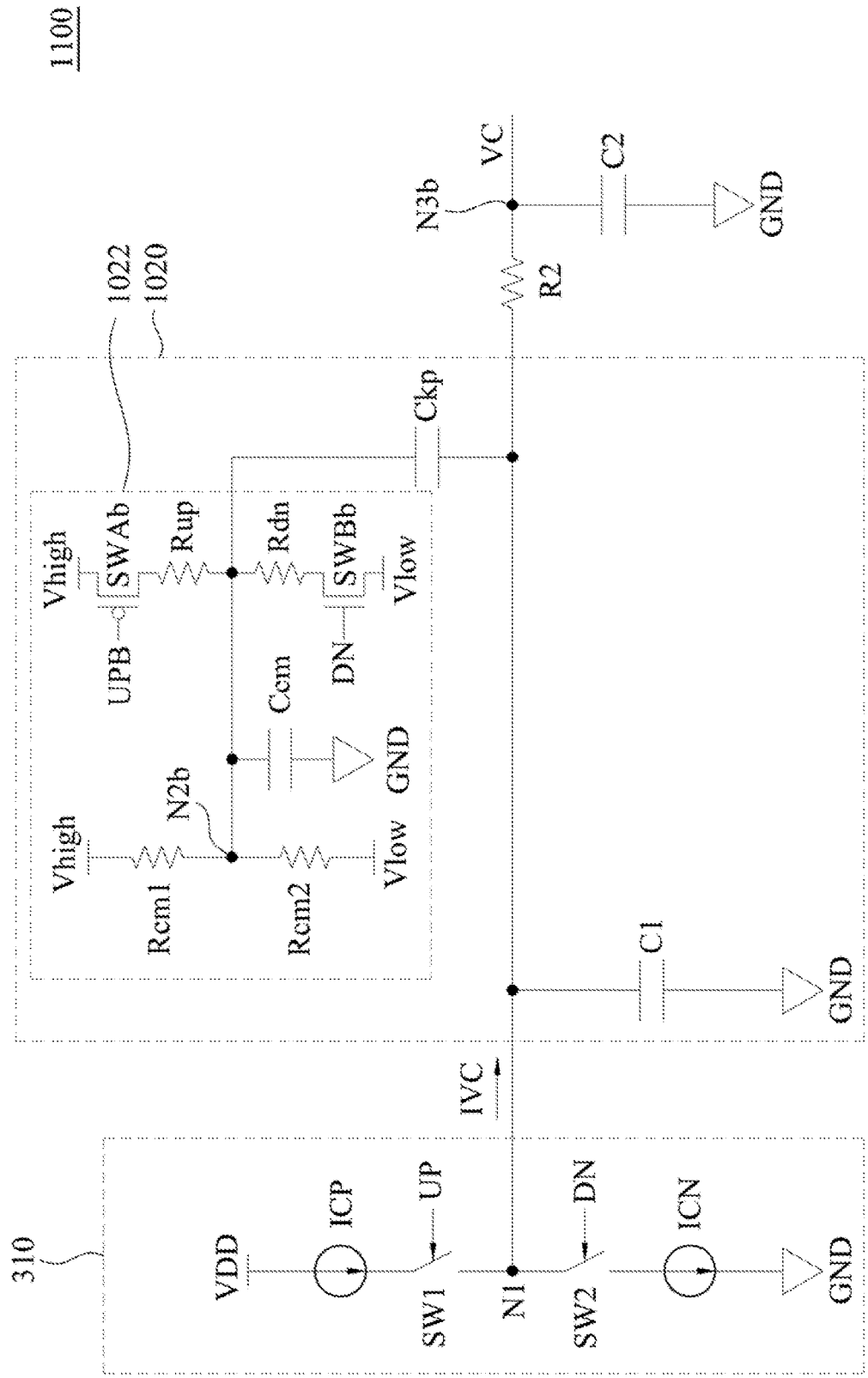
FIG. 11 is a schematic diagram of a charge pump filtering circuit according to some embodiments of the present disclosure.

Reference is made to FIG. 11. FIG. 11 is a schematic diagram of a charge pump filtering circuit 1100 according to some embodiments of the present disclosure. In some embodiments, the charge pump filtering circuit 1100 can be used to implement the charge pump filtering circuit 120 in FIG. 1 or the charge pump filtering circuit 220 in FIG. 2.

Compared to the charge pump filtering circuit 1000 in FIG. 10, the charge pump filtering circuit 1100 in FIG. 11 further includes a resistor R2 and a capacitor C2. The resistor R2 is coupled between the node N1 and an output node N3b. The capacitor C2 is coupled between the output node N3b and the ground terminal GND. The filtering voltage VC is generated at the output node N3b. By disposing the resistor R2 and the capacitor C2, the charge pump filtering circuit 1100 can achieve the low-pass filtering effect with more orders to cancel more ripple and noise.

Figure 12:
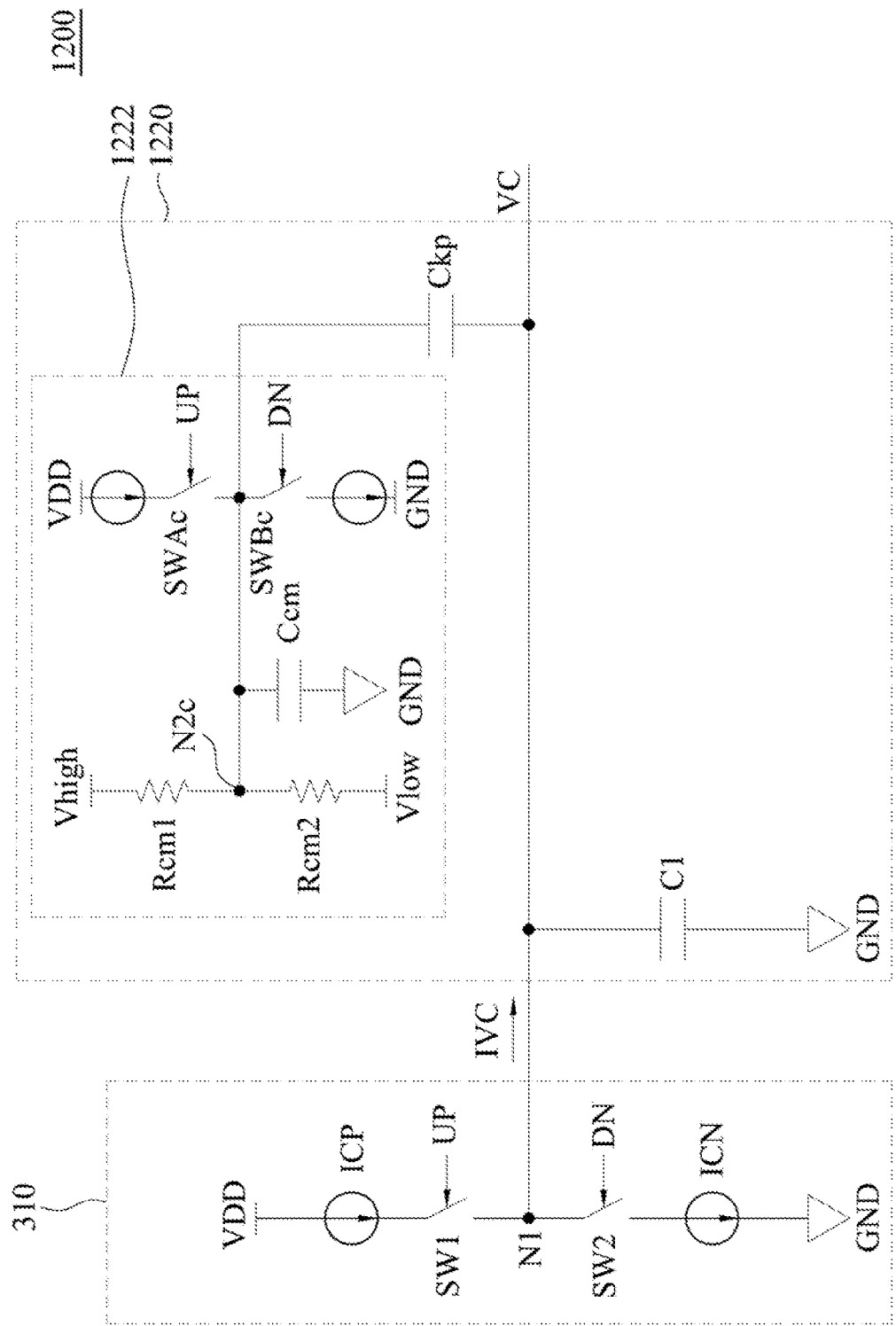
FIG. 12 is a schematic diagram of a charge pump filtering circuit according to some embodiments of the present disclosure.

Reference is made to FIG. 12. FIG. 12 is a schematic diagram of a charge pump filtering circuit 1200 according to some embodiments of the present disclosure. In some embodiments, the charge pump filtering circuit 1200 can be used to implement the charge pump filtering circuit 120 in FIG. 1 or the charge pump filtering circuit 220 in FIG. 2.

As illustrated in FIG. 12, the charge pump filtering circuit 1200 includes the charge pump circuit 310 and a filter circuit 1220, and the filter circuit 1220 can be a low-pass filter circuit.

The filter circuit 1220 includes a capacitor C1, a capacitor Ckp, and a voltage switching circuit 1222. The capacitor C1 is coupled between the node N1 and the ground terminal GND. The capacitor Ckp is coupled between the voltage switching circuit 1222 and the node N1.

The voltage switching circuit 1222 includes a resistor Rcm1, a resistor Rcm2, a capacitor Ccm, a control switch SWAc, and a control switch SWBc. The resistor Rcm1 and the resistor Rcm2 are coupled at a node N2c and are used to receive the voltage Vhigh and the voltage Vlow. The capacitor Ccm is coupled between the node N2c and the ground terminal GND. The control switch SWAc is coupled to the power terminal VDD. The control switch SWBc is coupled to the ground terminal GND. The capacitor Ckp is coupled between the node N2c and the node N1. The signal UP is used to turn on or turn off the control switch SWAc. The signal DN is used to turn on or turn off the control switch SWBc. When the SWAc is turned on, a current is formed from the power terminal VDD to the node N2c (as one current source). When the SWBc is turned on, a current is formed from the node N2c and the ground terminal GND (as another current source).

When the signal UP corresponds to the first logic value (e.g., the logic value 1) and the signal DN corresponds to the second logic value (e.g., the logic value 0), the control switch SWAc is turned on and the control switch SWBc is turned off. When the signal UP corresponds to the second logic value and the signal DN corresponds to the first logic value, the control switch SWAc is turned off and the control switch SWBc is turned on. When the signal UP and the signal DN correspond to the first logic value, the control switch SWAc and the control switch SWBc are turned on. When the signal UP and the signal DN correspond to the second logic value, the control switch SWAc and the control switch SWBc are turned off.

Figure 13:
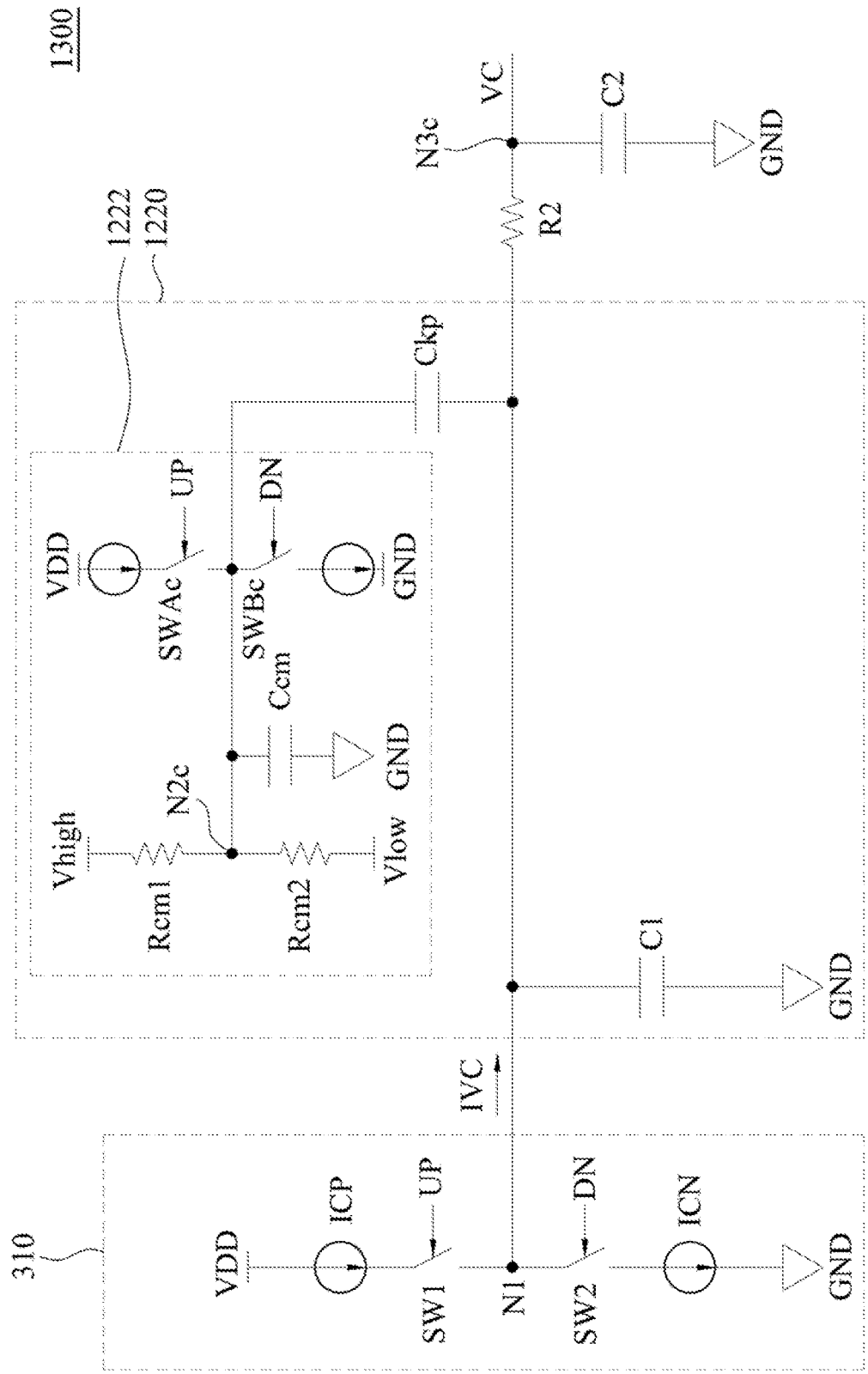
FIG. 13 is a schematic diagram of a charge pump filtering circuit according to some embodiments of the present disclosure.

Reference is made to FIG. 13. FIG. 13 is a schematic diagram of a charge pump filtering circuit 1300 according to some embodiments of the present disclosure. In some embodiments, the charge pump filtering circuit 1300 can be used to implement the charge pump filtering circuit 120 in FIG. 1 or the charge pump filtering circuit 220 in FIG. 2.

Compared to the charge pump filtering circuit 1200 in FIG. 12, the charge pump filtering circuit 1300 in FIG. 13 further includes a resistor R2 and a capacitor C2. The resistor R2 is coupled between the node N1 and an output node N3c. The capacitor C2 is coupled between the output node N3c and the ground terminal GND. The filtering voltage VC is generated at the output node N3c. By disposing the resistor R2 and the capacitor C2, the charge pump filtering circuit 1300 can achieve the low-pass filtering effect with more orders to cancel more ripple and noise.

As described above, the present disclosure does not need the resistor in the aforementioned conventional methods, and can use the voltage switching circuit and the capacitor (e.g., Ckp, Ckpup, Ckpdn) to achieve the effect equivalent to the resistor. Accordingly, under the same performance requirement, the size of the capacitor (e.g., C1) can be smaller and the present disclosure does not need the additional charge pump circuit and the additional operational amplifier. Thus, the present disclosure has simpler architecture and a smaller area.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A charge pump filtering circuit, comprising:
   a charge pump circuit comprising a first switch and a second switch, wherein the first switch and the second switch are directly coupled at a first node and are coupled between a power terminal and a ground terminal; and
   a filter circuit comprising:
   a first capacitor, wherein a terminal of the first capacitor directly coupled at the first node and another terminal of the first capacitor directly coupled at the ground terminal;
   a second capacitor; and
   a first voltage switching circuit, wherein the second capacitor is coupled to the first voltage switching circuit and directly coupled at the first node.

2. The charge pump filtering circuit of claim 1, wherein the first voltage switching circuit comprises:
   a plurality of control switches, wherein a plurality of first terminals of the plurality of control switches receive a plurality of voltages respectively, and a plurality of second terminals of the plurality of control switches are coupled to the second capacitor.

3. The charge pump filtering circuit of claim 2, wherein the plurality of control switches comprise:
   a first control switch configured to receive a first voltage;
   a second control switch configured to receive a second voltage; and
   a third control switch configured to receive a third voltage, wherein the second voltage is lower than first voltage and is higher than the third voltage.

4. The charge pump filtering circuit of claim 3, wherein the second voltage is half of a sum of the first voltage and the third voltage.

5. The charge pump filtering circuit of claim 3, wherein the first switch is controlled by a first signal, and the second switch is controlled by a second signal,
   wherein when the first signal corresponds to a first logic value and the second signal corresponds to a second logic value, the first control switch is turned on and the second control switch and the third control switch are turned off,
   wherein when the first signal corresponds to the second logic value and the second signal corresponds to the first logic value, the third control switch is turned on and the first control switch and the second control switch are turned off,
   wherein when the first signal and the second signal correspond to the first logic value or the first signal and the second signal correspond to the second logic value, the second control switch is turned on and the first control switch and the third control switch are turned off.

6. The charge pump filtering circuit of claim 2, wherein the first voltage switching circuit further comprises:
   a resistor coupled between the plurality of control switches and the second capacitor; and
   a third capacitor coupled between a second node and the ground terminal, wherein the resistor and the second capacitor are coupled at the second node.

7. The charge pump filtering circuit of claim 2, further comprising:
   a resistor coupled between the first node and an output node; and
   a third capacitor coupled between the output node and the ground terminal.

8. The charge pump filtering circuit of claim 1, further comprising:
   a third capacitor; and
   a second voltage switching circuit, wherein the third capacitor is coupled between the second voltage switching circuit and the first node,
   wherein the first voltage switching circuit comprises:
   a first control switch configured to receive a first voltage and coupled to the second capacitor; and
   a second control switch configured to receive a second voltage and coupled to the second capacitor,
   wherein the second voltage switching circuit comprises:
   a third control switch configured to receive the first voltage and coupled to the third capacitor; and
   a fourth control switch configured to receive the second voltage and coupled to the third capacitor, wherein the first voltage is higher than the second voltage.

9. The charge pump filtering circuit of claim 8, wherein the first switch is controlled by a first signal, and the second switch is controlled by a second signal,
   wherein when the first signal corresponds to a first logic value and the second signal corresponds to a second logic value, the first control switch and the third control switch are turned on and the second control switch and the fourth control switch are turned off,
   wherein when the first signal corresponds to the second logic value and the second signal corresponds to the first logic value, the second control switch and the fourth control switch are turned on and the first control switch and the third control switch are turned off,
   wherein when the first signal and the second signal correspond to the first logic value, the first control switch and the fourth control switch are turned on and the second control switch and the third control switch are turned off,
   wherein when the first signal and the second signal correspond to the second logic value, the second control switch and the third control switch are turned on and the first control switch and the fourth control switch are turned off.

10. The charge pump filtering circuit of claim 8, wherein the first voltage switching circuit further comprises:
    a first resistor coupled between the first control switch, the second control switch, and the second capacitor; and
    a fourth capacitor coupled between a second node and the ground terminal, wherein the first resistor and the second capacitor are coupled at the second node,
    wherein the second voltage switching circuit further comprises:
    a second resistor coupled between the third control switch, the fourth control switch, and the third capacitor; and
    a fifth capacitor coupled between a third node and the ground terminal, wherein the second resistor and the third capacitor are coupled at the third node.

11. The charge pump filtering circuit of claim 8, further comprising:
- a resistor coupled between the first node and an output node; and
- a fourth capacitor coupled between the output node and the ground terminal.

12. The charge pump filtering circuit of claim 8, wherein a capacitance value of the second capacitor is equal to a capacitance value of the third capacitor.

13. The charge pump filtering circuit of claim 1, wherein the first voltage switching circuit further comprises:
- a first resistor and a second resistor coupled at a second node and configured to receive a first voltage and a second voltage;
- a third capacitor coupled between the second node and the ground terminal;
- a first control switch configured to receive the first voltage;
- a second control switch configured to receive the second voltage; and
- a third resistor and a fourth resistor coupled at the second node and coupled between the first control switch and the second control switch,
- wherein the second capacitor is coupled between the second node and the first node.

14. The charge pump filtering circuit of claim 13, wherein the first switch is controlled by a first signal, and the second switch is controlled by a second signal,
- wherein when the first signal corresponds to a first logic value and the second signal corresponds to a second logic value, the first control switch is turned on and the second control switch is turned off,
- wherein when the first signal corresponds to the second logic value and the second signal corresponds to the first logic value, the second control switch is turned on and the first control switch is turned off,
- wherein when the first signal and the second signal correspond to the first logic value, the first control switch and the second control switch are turned on,
- wherein when the first signal and the second signal correspond to the second logic value, the first control switch and the second control switch are turned off.

15. The charge pump filtering circuit of claim 13, further comprising:
- a resistor coupled between the first node and an output node; and
- a fourth capacitor coupled between the output node and the ground terminal.

16. The charge pump filtering circuit of claim 1, wherein the first voltage switching circuit comprises:
- a first resistor and a second resistor coupled at a second node and configured to receive a first voltage and a second voltage;
- a third capacitor coupled between the second node and the ground terminal;
- a first control switch coupled to the power terminal; and
- a second control switch coupled to the ground terminal and coupling the first control switch at the second node,
- wherein the second capacitor is coupled between the second node and the first node.

17. The charge pump filtering circuit of claim 16, wherein the first switch is controlled by a first signal, and the second switch is controlled by a second signal,
- wherein when the first signal corresponds to a first logic value and the second signal corresponds to a second logic value, the first control switch is turned on and the second control switch is turned off,
- wherein when the first signal corresponds to the second logic value and the second signal corresponds to the first logic value, the second control switch is turned on and the first control switch is turned off,
- wherein when the first signal and the second signal correspond to the first logic value, the first control switch and the second control switch are turned on,
- wherein when the first signal and the second signal correspond to the second logic value, the first control switch and the second control switch are turned off.

18. The charge pump filtering circuit of claim 16, further comprising:
- a resistor coupled between the first node and an output node; and
- a fourth capacitor coupled between the output node and the ground terminal.

19. A phase-locked loop circuit, comprising:
- a phase frequency detector circuit configured to generate a first signal and a second signal according to a feedback clock signal and a reference clock signal;
- a charge pump filtering circuit configured to generate a filtering voltage according to the first signal and the second signal;
- a voltage-controlled oscillator circuit configured to generate an output signal according to the filtering voltage; and
- a frequency divider configured to generate the feedback clock signal according to the output signal, wherein the charge pump filtering circuit comprises:
  - a charge pump circuit comprising a first switch and a second switch, wherein the first switch and the second switch are directly coupled at a first node and are coupled between a power terminal and a ground terminal; and
  - a filter circuit comprising:
    - a first capacitor, wherein a terminal of the first capacitor directly coupled at the first node and another terminal of the first capacitor directly coupled at the ground terminal;
    - a second capacitor; and
    - a first voltage switching circuit, wherein the second capacitor is coupled to the first voltage switching circuit and directly coupled at the first node.

20. A clock data recovery circuit, comprising:
- a phase detector circuit configured to generate a first signal and a second signal according to a feedback clock signal and data;
- a charge pump filtering circuit configured to generate a filtering voltage according to the first signal and the second signal;
- a voltage-controlled oscillator circuit configured to generate an output signal according to the filtering voltage; and
- a frequency divider configured to generate the feedback clock signal according to the output signal, wherein the charge pump filtering circuit comprises:
  - a charge pump circuit comprising a first switch and a second switch, wherein the first switch and the second switch are directly coupled at a first node and are coupled between a power terminal and a ground terminal; and
  - a filter circuit comprising:
    - a first capacitor, wherein a terminal of the first capacitor directly coupled at the first node and another terminal of the first capacitor directly coupled at the ground terminal;
    - a second capacitor; and a first voltage switching circuit, wherein the second capacitor is coupled to the first voltage switching circuit and directly coupled at the first node.

\* \* \* \* \*